US009753806B1

(12) United States Patent
Glancy et al.

(10) Patent No.: US 9,753,806 B1
(45) Date of Patent: Sep. 5, 2017

(54) IMPLEMENTING SIGNAL INTEGRITY FAIL RECOVERY AND MAINLINE CALIBRATION FOR DRAM

(71) Applicant: International Business Machines Corporation, Armonk, NY (US)

(72) Inventors: Stephen P. Glancy, Poughkeepsie, NY (US); Jeremy R. Neaton, Fishkill, NY (US); Anuwat Saetow, Austin, TX (US); Jacob D. Sloat, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/293,645

(22) Filed: Oct. 14, 2016

(51) Int. Cl.
*G11C 16/04* (2006.01)
*G06F 11/14* (2006.01)
*G11C 29/52* (2006.01)

(52) U.S. Cl.
CPC ......... *G06F 11/142* (2013.01); *G11C 29/52* (2013.01); *G06F 2201/805* (2013.01)

(58) Field of Classification Search
CPC .............................. G11C 16/04; G11C 16/52
USPC ............. 365/185.01–185.33, 189.011–225.7
See application file for complete search history.

(56) References Cited

U.S. PATENT DOCUMENTS

| | | | |
|---|---|---|---|
| 7,681,094 B2 | 3/2010 | Guterman et al. | |
| 8,078,918 B2 | 12/2011 | Diggs et al. | |
| 8,234,528 B2 | 7/2012 | Jeddeloh | |
| 8,854,073 B2 | 10/2014 | Grosch et al. | |
| 2009/0217281 A1 | 8/2009 | Borkenhagen | |
| 2014/0281326 A1* | 9/2014 | Van Huben | G11C 7/225 711/167 |

OTHER PUBLICATIONS

Tonti, "Reliability, design qualification, and prognostic opportunity of in die E-Fuse." Prognostics and Health Management (PHM), 2011 IEEE Conference on. IEEE, 2011.
Lorente et al. "Combining RAM technologies for hard-error recovery in L1 data caches working at very-low power modes." Proceedings of the Conference on Design, Automation Test in Europe, EDA Consortium, 2013.
Takase et al., "A 1.6-GByte/s DRAM with flexible mapping redundancy technique and additional refresh scheme." Solid-State Circuits, IEEE Journal of 34.11 (1999): 1600-1606.
Jung et al., . "Lowering minimum supply voltage for power-efficient cache design by exploiting data redundancy." ACM Transactions on Design Automation of Electronic Systems. (TODAES) 21.1 (2015) 11.

\* cited by examiner

*Primary Examiner* — Harry W Byrne
(74) *Attorney, Agent, or Firm* — Joan Pennington

(57) ABSTRACT

A method, system and memory controller are provided for implementing signal integrity fail recovery and mainline calibration for Dynamic Random Access Memory (DRAM). After identifying a failed DRAM, the DRAM is marked as bad and taken out of mainline operation. Characterization tests and periodic calibrations are run to evaluate optimal settings and to determine if the marked DRAM is recoverable. If recoverable, the marked DRAM chip is redeployed. If unrecoverable, error reporting is provided to the user.

20 Claims, 8 Drawing Sheets

400

| ENTRY | ADDRESS | SETTINGS |
|---|---|---|
| 0 | 21 | +1 |
| 1 | | |
| 2 | | |
| 4 | | |
| 4 | | |
| 5 | | |
| 6 | | |
| 7 | | |

| ENTRY | ADDRESS | SETTINGS |
|---|---|---|
| 0 | 21 | +1 |
| 1 | 6 | +1 |
| 2 | | |
| 4 | | |
| 4 | | |
| 5 | | |
| 6 | | |
| 7 | | |

| ENTRY | ADDRESS | SETTINGS |
|---|---|---|
| 0 | 21 | +1 |
| 1 | 6 | +1 |
| 2 | 9 | +1 |
| 4 | 51 | +1 |
| 4 | 12 | +1 |
| 5 | 17 | +1 |
| 6 | 4 | +1 |
| 7 | 24 | +1 |

| ENTRY | ADDRESS | SETTINGS |
|---|---|---|
| 0 | 21 | +1 |
| 1 | ~~6~~ | +1 |
| 2 | 9 | +1 |
| 4 | 51 | +1 |
| 4 | 12 | +1 |
| 5 | 17 | +1 |
| 6 | 4 | +1 |
| 7 | 24 | +1 |

| ENTRY | ADDRESS | SETTINGS |
|---|---|---|
| 0 | 21 | +1 |
| 1 | ~~6~~ 82 | +1 |
| 2 | 9 | +1 |
| 4 | 51 | +1 |
| 4 | 12 | +1 |
| 5 | 17 | +1 |
| 6 | 4 | +1 |
| 7 | 24 | +1 |

| ENTRY | ADDRESS | SETTINGS |
|---|---|---|
| 0 | 21 | +1 |
| 1 | ~~6 82~~ | +1 |
| 2 | 9 | +1 |
| 4 | ~~51~~ | +1 |
| 4 | ~~12~~ | +1 |
| 5 | ~~17~~ | +1 |
| 6 | 4 | +1 |
| 7 | 24 | +1 |

| ENTRY | ADDRESS | SETTINGS |
|---|---|---|
| 0 | ~~21~~ 1 | ~~+1~~ +2 |
| 1 | ~~6 82~~ | ~~+1~~ |
| 2 | ~~9~~ | ~~+1~~ |
| 4 | ~~51~~ | ~~+1~~ |
| 4 | ~~12~~ | ~~+1~~ |
| 5 | ~~17~~ | ~~+1~~ |
| 6 | ~~4~~ | ~~+1~~ |
| 7 | ~~24~~ | ~~+1~~ |

FIG. 4G

IMPLEMENTING SIGNAL INTEGRITY FAIL RECOVERY AND MAINLINE CALIBRATION FOR DRAM

FIELD OF THE INVENTION

The present invention relates generally to the data processing field, and more particularly, relates to a method, system and memory controller for implementing signal integrity fail recovery and mainline calibration for Dynamic Random Access Memory (DRAM).

DESCRIPTION OF THE RELATED ART

Signal integrity (SI) issues are becoming more prevalent as memory speeds increase. For example, such issues include ringback, poor setup and hold margins. SI fails use a limited number of marks available that may be needed for hard fails.

Currently there is no recovery mechanism for DRAM SI fails without conducting Initial Product Load (IPL) during system operation. An IPL takes part or all of the system out of mainline mode, contributing to additional system downtime. Typically a DRAM is marked as bad and taken out of mainline operations. Then the DRAM sits idle and powered on. Current Reliability, Availability, and Serviceability (RAS) functions cannot handle a number of fails beyond a set threshold of fails.

A need exists for an effective mechanism to enable enhanced signal integrity (SI) fail recovery and mainline calibration for Dynamic Random Access Memory (DRAM).

SUMMARY OF THE INVENTION

Principal aspects of the present invention are to provide a method, system, and memory controller for implementing signal integrity fail recovery and mainline calibration for Dynamic Random Access Memory (DRAM). Other important aspects of the present invention are to provide such method, system and memory controller, substantially without negative effects and that overcome some of the disadvantages of prior art arrangements.

In brief, a method, system, and memory controller are provided for implementing signal integrity fail recovery and mainline calibration for Dynamic Random Access Memory (DRAM). After identifying a failed DRAM, the DRAM is marked as bad and taken out of mainline operation. If the failing DRAM is marked as an SI related fail, characterization tests and periodic calibrations are run to evaluate optimal settings and to determine if the marked DRAM is recoverable. If recoverable, the marked DRAM is redeployed. If unrecoverable, error reporting is provided to the user.

In accordance with features of the invention, the characterization tests and periodic calibrations include a shmoo characteristic conducted on at least one selected mark-independent SI setting. Logs are saved for error reporting and failure analysis.

In accordance with features of the invention, when the DRAM is marked as bad and taken out of mainline operation, operations on the marked DRAM are performed without impacting mainline operations.

In accordance with features of the invention, the characterization tests and periodic calibrations include characterization tests to identify a reference voltage level where the marked DRAM is recoverable.

In accordance with features of the invention, the characterization tests and periodic calibrations include sequentially running shmoos when a SI fail is not recovered.

In accordance with features of the invention, the characterization tests and periodic calibrations include shmoos conducted on at least one selected mark-only SI setting, for example, for providing plots of reference voltage and signal delays over specified ranges for showing a range of conditions in which the marked DRAM operates.

BRIEF DESCRIPTION OF THE DRAWINGS

The present invention together with the above and other objects and advantages may best be understood from the following detailed description of the preferred embodiments of the invention illustrated in the drawings, wherein:

FIGS. 4A, 4B, 4C, 4D, 4E, 4F, and 4G illustrate example write fail operations for implementing signal integrity fail recovery and mainline calibration.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and memory controller are provided for implementing signal integrity fail recovery and mainline calibration for Dynamic Random Access Memory (DRAM).

Figure 1:
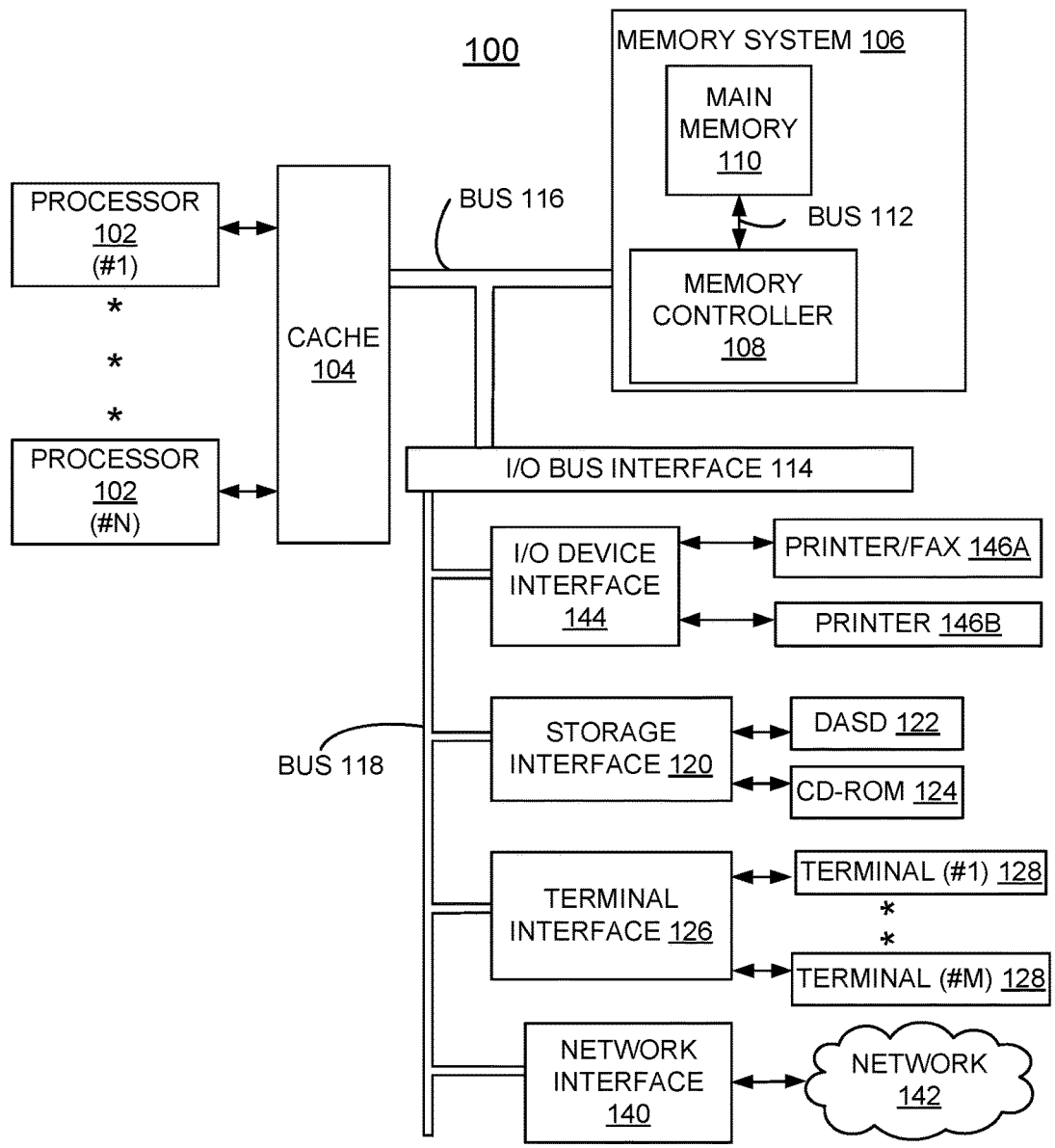
FIG. 1 illustrates an example computer system for implementing signal integrity fail recovery and mainline calibration for Dynamic Random Access Memory (DRAM) in accordance with preferred embodiments.

Having reference now to the drawings, in FIG. 1, there is shown an example computer system generally designated by the reference character 100 for implementing signal integrity fail recovery and mainline calibration for Dynamic Random Access Memory (DRAM) in accordance with preferred embodiments.

Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a memory system 106 including a memory controller 108 and a main memory 110 connected by a bus 112. Bus 112 is one or more busses that send address/command information to main memory 110 and send and receive data from the memory 110. Main memory 110 is a random-access semiconductor memory for storing data, including programs. Main memory 110 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, memory controller 108 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, and a I/O device interface 134 coupled to I/O devices, such as a first printer/fax 136A, and a second printer 136B.

I/O bus interface 114 communicates with multiple I/O interface units 120, 126, 130, and 134, which are also known as I/O processors (IOPs) or I/O adapters (IOAs), through system I/O bus 116. System I/O bus 116 is, for example, an industry standard PCI bus, or other appropriate bus technology.

Computer system 100 is shown in simplified form sufficient for understanding the present invention. The illustrated computer system 100 is not intended to imply architectural or functional limitations. Although main memory 110 of main memory system 106 is represented conceptually in FIG. 1 as a single entity, it will be understood that in fact the main memory is more complex. For example, main memory system 106 comprises multiple modules and components. The present invention can be used with various hardware implementations and systems and various other internal hardware devices.

Figure 2:
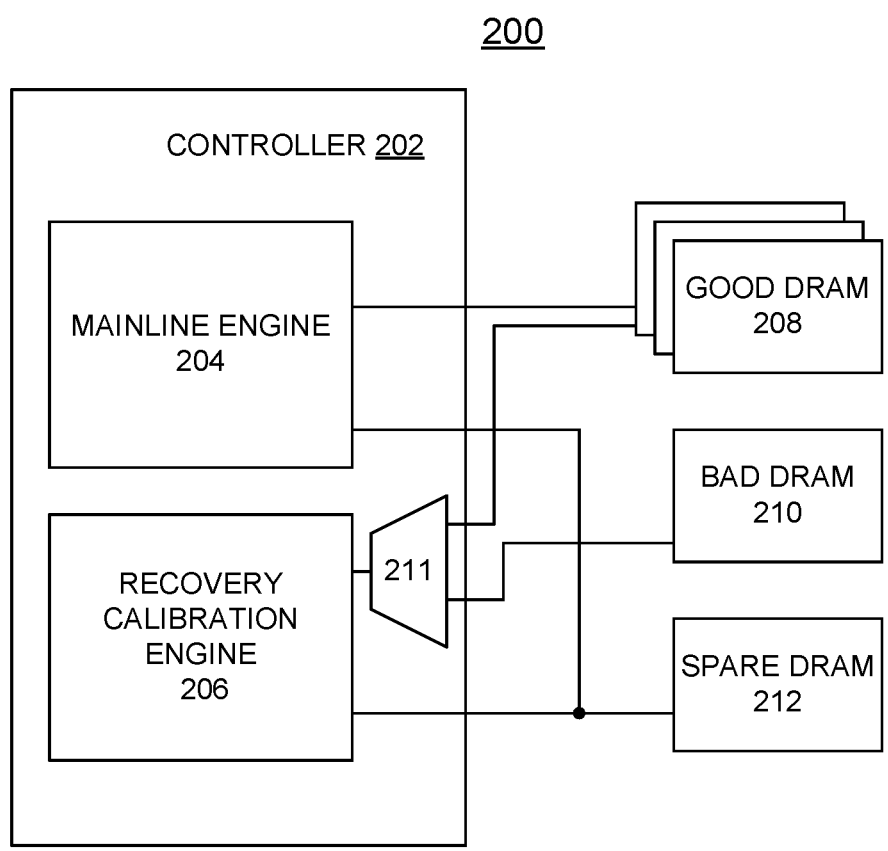
FIG. 2 illustrates an example controller and DRAM subsystem of FIG. 1 for implementing signal integrity fail recovery and mainline calibration in accordance with preferred embodiments.

Referring also to FIG. 2, there is shown an example memory subsystem generally designated by the reference character 200 for implementing signal integrity fail recovery and mainline calibration in accordance with preferred embodiments. As shown, memory subsystem 200 includes a controller 202 including a mainline engine 204 and a recovery calibration engine 206. FIG. 2 shows the memory subsystem after a failing DRAM has been detected and marked off. It is important to note that while FIG. 2 demonstrates a case involving a bad DRAM 210, that same block can be represented as Target DRAM for periodic calibration. The method described here uses examples in which a failing DRAM attempts to be recovered, however the method can also be applied to cases where a periodic calibration is conducted as a preventative measure to ensure optimal signal integrity (SI) settings. In the periodic calibration scenario the memory controller 200 can iterate through each active DRAM by invoking the spare DRAM 212 for a Target DRAM, run the shmoo calibration tests, determine the optimal settings, redeploy Target DRAM, and move on to the next DRAM. The mainline engine 204 is coupled to a good DRAM 208, and spare DRAM 212, or only to the functional DRAMs 208. The recovery calibration engine 206 is coupled to a good DRAM 208 and a bad DRAM 210 via multiplexer 211, and is coupled to the spare DRAM 212, allowing recovery calibration engine to compare returning data from the bad DRAM for the purposes of periodic calibration or shmooing. It should be obvious to those skilled in the art that each of the DRAMs 208, 210, and 212 could represent one or more DRAMs.

In accordance with features of the invention, after identifying the failed DRAM, the DRAM is marked as bad and taken out of mainline operation. When the DRAM is marked as bad and taken out of mainline operation, operations on the marked DRAM can be performed without impacting mainline operations. Characterization tests and/or periodic calibrations are run to determine if the marked DRAM is recoverable, determined if a passing group of settings are found, and to evaluate optimal settings. If recoverable, the marked DRAM chip is redeployed. If unrecoverable, error reporting is provided to the user. Additional actions can be taken at this point, such as moving the device into a power down state to conserve energy. However, it is obvious to those skilled in the art that other actions could be taken upon finding an unrecoverable DRAM. Characterization tests and periodic calibrations include characterization tests, for example, to identify a voltage level where the marked DRAM is recoverable.

In accordance with features of the invention, the characterization tests and periodic calibrations include shmoos conducted on at least one selected mark-independent SI setting, for example, for providing shmoo plots of parameters over specified ranges for showing a range of conditions in which the marked DRAM operates. The characterization tests and periodic calibrations include sequentially running shmoos when a SI fail is not recovered.

Read Fail Example 1

For example when an SI fail is identified, the DRAM 210 is marked as bad and taken out of mainline. All read data from bad DRAM 210 and active spare DRAM 212 goes to the recovery calibration engine 206. Simultaneously, the data from the spare DRAM is sent to the mainline engine 204. The recovery calibration engine muxes the data from all the DRAMs and selects the appropriate bits from the bad DRAM 210 as well as the data from the spare DRAM. The data used by the recovery calibration engine 206 can be user data during mainline operation. Both the mainline traffic can continue and the recovery shmoo tests can be performed in tandem without performance penalties to mainline as reads and writes stream in depending on the user's activity. Other options for data involve predefined patterns, hard coded values, or from a Linear Feedback Shift Register (LFSR). It is obvious to one skilled in the art that many options for data can be used by the recovery calibration engine 206. The recovery calibration engine 206 moves read delay settings and compares read data against the good data of spare DRAM 212. If shmoo results show a large enough digital signal data eye size, then read data is continued checking at new optimal delay settings for a configurable amount of time. This ensures some runtime with user data before putting the device back in mainline. If new delay settings pass, then the bad DRAM 210 is put back into mainline. The spare DRAM 212 is again available for use by any DRAM on the rank if marked bad. If shmoo results show poor eye sizes, then additional tests optionally are performed or the bad DRAM 210 identified as unrecoverable.

Read Fail Example 2

For example when a SI fail is identified, the DRAM 210 is marked as bad and taken out of mainline. All read data from bad DRAM 210 and active spare DRAM 210 goes to the recovery calibration engine 206. If a 1D shmoo does not result in passing delay settings, then the recovery calibration engine 206 optionally moves voltage reference RD_VREF in addition to the read delay settings (2D shmoo). Then the same steps as in Read Fail Example 1 are repeated. If good margins result at the particular voltage reference VREF, prolonged testing is provided with new settings. Then bad DRAM 210 is-deployed into mainline if prolonged testing passes. If the 2D shmoo fails to produce passing settings, additional tests optionally are performed or bad DRAM 210 is identified as unrecoverable. Additional tests can be used in this phase, such as driver strengths, and termination settings.

Figure 3:
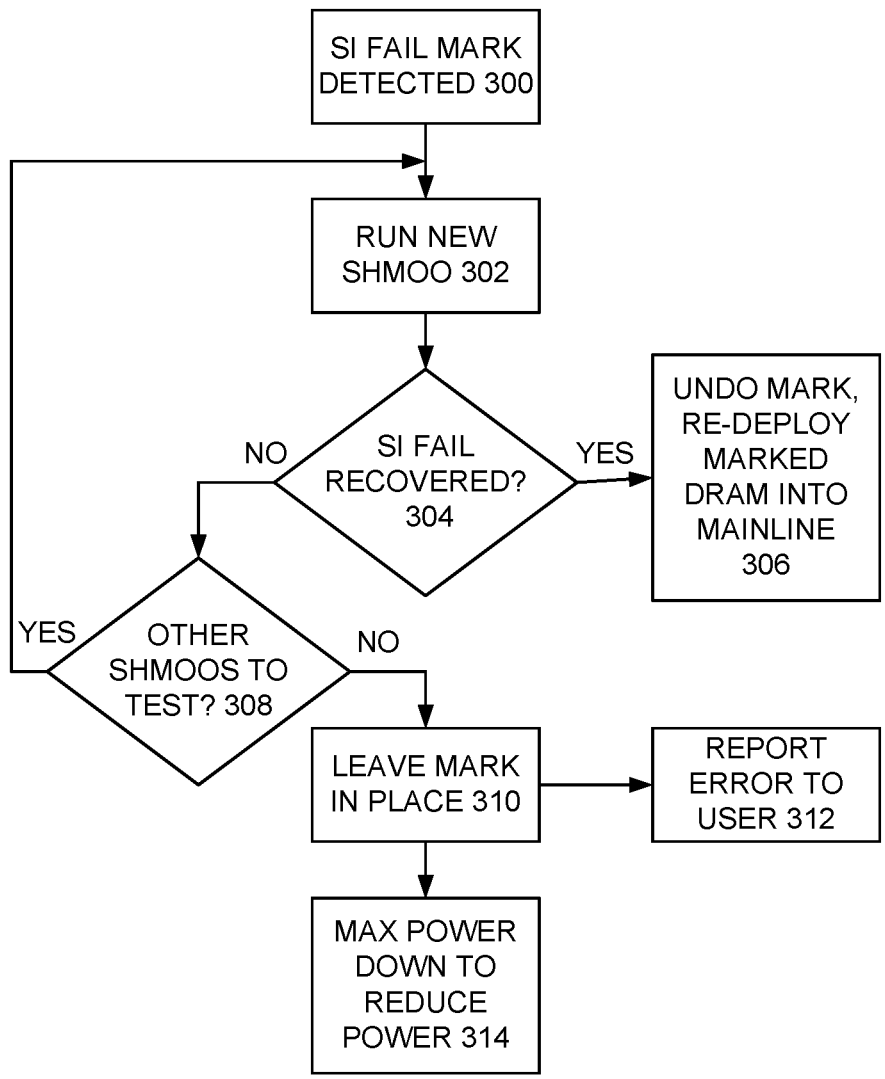
FIG. 3 is a flow chart illustrating example operations for implementing signal integrity fail recovery and mainline calibration of FIGS. 1 and 2 in accordance with preferred embodiments.

FIG. 3 shows the methodology for testing a signal integrity based fail with a variety of shmoos, determining if any of the shmoos allows the DRAM to be recovered, and taking a recovery or failing action depending upon if the DRAM is recovered. Starting with a SI fail mark detected as indicated at a block 300, then running a new shmoo is performed as indicated at a block 302. Checking for an SI fail being recovered is performed as indicated at a decision block 304. One example of a test to see if the SI fail was recovered is to continue to run with the DRAM as marked for a certain period of time. If fails below a predetermined threshold are found, then the DRAM would be noted as recovered. Another example is to compare the shmoo results against the predetermined thresholds. If the shmoo results are better than a predetermined threshold, then the DRAM would be noted as recovered. It is obvious to one who is skilled in the art that these examples are not the only two methods for checking if a DRAM has recovered from a signal integrity based fail. These examples are solely used to clarify the invention. If the SI fail is recovered, then the SI fail mark is undone, the unmarked DRAM 210 is redeployed into the mainline, good DRAM 208 as indicated at a block 306. The redeployment process could be accomplished by transferring all data from the spare devices to the recovered DRAM [AI], much like the original process for invoking the spare DRAM where all data from the bad DRAM is transferred over to the spare. When the SI fail is not recovered, then checking for other shmoos to test is performed as indicated at a decision block 308. The next shmoo to be run could be determined by a pre programmed list of shmoos or could be based upon results seen in the prior shmoo. It is obvious to one skilled in the art that other methods could be used and that these examples are solely used for the purpose of illustrating the invention. When another shmoo to test is found, then running a new shmoo is performed returning to block 302. When another shmoo to test is not found, then the mark is left in place as indicated at a block 310. An error is reported to the user as indicated at a block 312. Depending upon the user's input, the marked DRAM could be set to enter max powered down state to reduce power as indicated at a block 314.

FIGS. 4A, 4B, 4C, 4D, 4E, 4F, and 4G illustrate example write fail operations for implementing signal integrity fail recovery and mainline calibration.

Write Fail Example 3

While the process for testing reads is simple, the process for testing writes is more complex if no write CRC functionality is enabled on the DRAM. If the write CRC function is enabled on the DRAM then the invention can use a write CRC fail to determine that the current shmoo results failed. If write CRC is not present, then a write and read test must be conducted to determine the results of any given setting. That read can occur at any point in the future. In order to not impact mainline operations, no additional writes or reads can be run, as these would cause delays to mainline commands and additional power consumption. There is no clear way to identify original write settings at the time of doing a read. A need exists to ensure enough writes are tested (with reads) before changing the write settings. Whenever a write goes out to the rank the bad DRAM is on, the address and current write settings are saved into an N-deep array. Having space for multiple addresses increases the chance of getting read hits for the current settings. When a read to one of the addresses in the array occurs, the results are saved and the address and accompanied settings are removed to allow for new write settings to be added. Then the data compare between bad DRAM and spare DRAM is performed, with the results influencing the shmoo. After an adequate number of writes are tested, new write settings are applied. If the shmoo is moving the WR VREF settings then, the shmoo requires putting the entire rank into PDA mode, updating the settings in the bad DRAM using PDA, and then returning the rank to mainline mode. This can be done when there is minimal activity on the rank. The following discussion of the figures walks through an example of a write shmoo conducted without write CRC enabled. All values are used solely for the purpose of illustration. It is obvious to one skilled in the art that these values and different values could be used when conducting a shmoo.

Referring to FIG. 4A, first five (5) writes at each write setting must be done before moving on. An example write fail generally designated by reference character 400 starts with a first write to address "21" with settings at "+1", as shown.

Referring to FIG. 4B, the example write fail generally designated by reference character 410 continues with a second write to address "6" with settings at "+1", as shown.

Referring to FIG. 4C, the example write fail generally designated by reference character 420 continues with six more writes to respective addresses 9, 51, 12, 17, 4, and 24 with settings at "+1", as shown.

Referring to FIG. 4D, the example write fail generally designated by reference character 430 continues with a read to address 6 with settings at "+1", as shown. The read identifies pass/fail, increments writes_done counter, and clears the entry in array.

Referring to FIG. 4E, the example write fail generally designated by reference character 440 continues with a write to address 82 with settings at "+1", as shown.

Referring to FIG. 4F, the example write fail generally designated by reference character 450 continues with four reads done to addresses in the array, with five writes now tested at settings "+1", as shown.

Referring to FIG. 4G, the example write fail generally designated by reference character 460 continues five writes are tested at settings "+1", the entire array is cleared, the write settings changes are made to "+2", as shown. The same process is repeated.

In accordance with features of the invention, it should be understood that other read and write fail testing can be performed. For example, input could be taken from scrub results in accordance with principles of the invention. Scrub can identify read or write fail. Scrub does a read followed by a write of good data and another read and can save time on recovery by running pertinent read or write tests. It should be obvious to those skilled in the art that the given example is used for illustration and other methods could be used to determine a passing or failing result.

Figure 5:
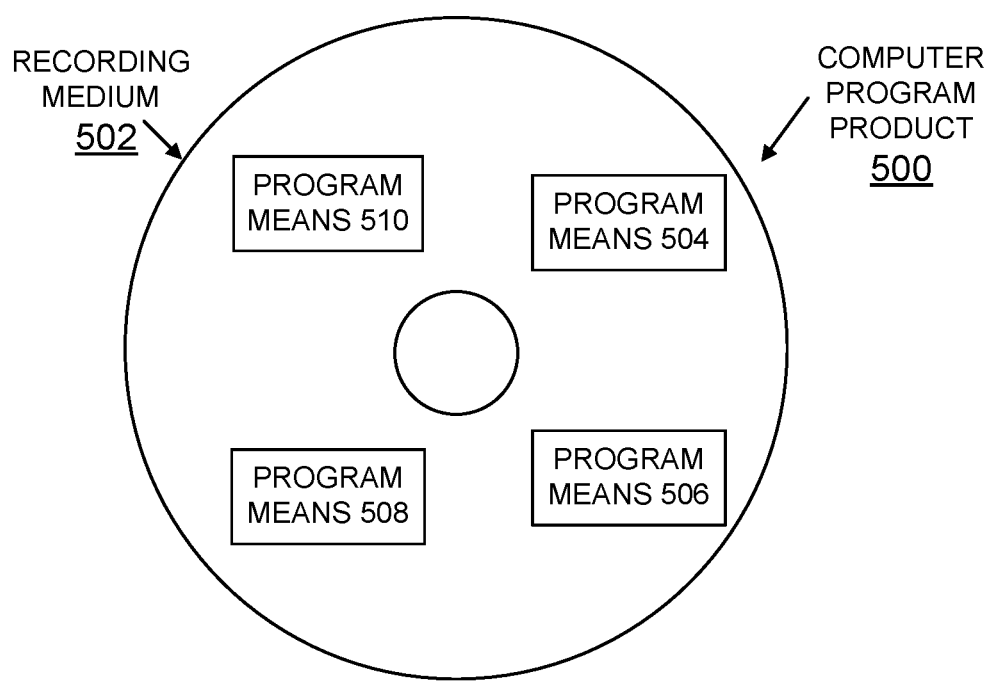
FIG. 5 is a block diagram illustrating a computer program product in accordance with the preferred embodiment.

Referring now to FIG. 5, an article of manufacture or a computer program product 500 of the invention is illustrated. The computer program product 500 is tangibly embodied on a non-transitory computer readable storage medium that includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing signal integrity fail recovery and mainline calibration for DRAM in a memory subsystem 200 of FIG. 2 in accordance with preferred embodiments.

A sequence of program instructions or a logical assembly of one or more interrelated modules defined by the recorded program means 504, 506, 508, and 510, direct the memory subsystem 200 for implementing signal integrity fail recovery and mainline calibration for DRAM of the preferred embodiments.

While the present invention has been described with reference to the details of the embodiments of the invention shown in the drawing, these details are not intended to limit the scope of the invention as claimed in the appended claims.

What is claimed is:

1. A method for implementing signal integrity (SI) fail recovery and mainline calibration for Dynamic Random Access Memory (DRAM) comprising:
    detecting a signal integrity (SI) fail for a DRAM, marking the DRAM as failed and taking the marked DRAM out of mainline operation;
    running characterization tests and periodic calibrations to evaluate optimal settings and to determine if the marked DRAM is recoverable;
    responsive to identifying a recoverable DRAM, redeploying the marked DRAM to mainline operation; and
    responsive to identifying an unrecoverable DRAM, reporting an error to a user.

2. The method as recited in claim 1 includes responsive to identifying an unrecoverable DRAM, powering down the unrecoverable DRAM.

3. The method as recited in claim 1 wherein running characterization tests and periodic calibrations include performing a shmoo characteristic on at least one selected mark-independent SI setting.

4. The method as recited in claim 3 includes saving logs used for error reporting and failure analysis.

5. The method as recited in claim 1 wherein detecting the signal integrity fail for a DRAM, marking the DRAM as failed and taking the marked DRAM out of mainline operation includes performing operations on the marked DRAM without impacting mainline operations.

6. The method as recited in claim 5 includes providing a memory controller including a mainline engine and a recovery calibration engine, coupling said memory controller mainline engine to good DRAM, and spare DRAM and coupling said memory controller recovery calibration engine to the marked DRAM, and the spare DRAM, said recovery calibration engine using user data to prevent impacting mainline performance.

7. The method as recited in claim 6 wherein running characterization tests and periodic calibrations includes said memory controller recovery calibration engine moving read delay settings and comparing read data from the marked DRAM against data of a spare DRAM to determine if the marked DRAM is recoverable.

8. The method as recited in claim 7 includes said memory controller recovery calibration engine running a new shmoo to determine if the marked DRAM is recoverable.

9. The method as recited in claim 8 includes said memory controller recovery calibration engine running another shmoo when the SI fail for the marked DRAM is not recovered.

10. A memory system for implementing signal integrity fail recovery and mainline calibration for Dynamic Random Access Memory (DRAM) comprising:
    a memory controller,
    said memory controller mainline engine detecting a signal integrity fail for a DRAM, marking the DRAM as failed and taking the marked DRAM out of mainline operation;
    said memory controller running characterization tests and periodic calibrations to evaluate optimal settings and to determine if the marked DRAM is recoverable;
    said memory controller responsive to a recoverable DRAM, redeploying the marked DRAM to mainline operation; and
    said memory controller responsive to an unrecoverable DRAM, reporting an error to a user.

11. The memory system as recited in claim 10, includes control code stored on a computer readable medium, and wherein said memory controller uses said control code to implement signal integrity fail recovery and mainline calibration.

12. The memory system as recited in claim 10 wherein said memory controller includes a mainline engine and a recovery calibration engine.

13. The system as recited in claim 12 includes said memory controller mainline engine coupled to good DRAM, and spare DRAM and said memory controller recovery calibration engine coupled to the marked DRAM, and the spare DRAM.

14. The system as recited in claim 10 wherein said memory controller running characterization tests and periodic calibrations includes said memory controller recovery calibration engine moving read delay settings and comparing read data from the marked DRAM against data of a spare DRAM.

15. The system as recited in claim 14 includes said memory controller using a digital signal data eye size to determine if the marked DRAM is recoverable.

16. The system as recited in claim 15 includes said memory controller continued checking at new optimal delay settings for a configurable amount of time before redeploying the marked DRAM to mainline operation.

17. The system as recited in claim 15 includes said memory controller moving a voltage reference together with read delay settings using resulting margins at the voltage reference to determine if the marked DRAM is recoverable.

18. The system as recited in claim 10 wherein said memory controller running characterization tests and periodic calibrations includes said memory controller, running a new shmoo and checking for an SI fail being recovered.

19. The system as recited in claim 18 includes said memory controller, responsive to SI fail not recovered, checking for other shmoos to test the marked DRAM.

20. The system as recited in claim 19 includes said memory controller identifying and running another shmoo to test the marked DRAM.

* * * * *